US005427382A

United States Patent [19]

Pate et al.

[11] Patent Number: 5,427,382

[45] Date of Patent: Jun. 27, 1995

[54] REPAIR KIT FOR THREE-DIMENSIONAL ANIMAL TARGETS

[76] Inventors: Elvis O. Pate, 12640 Sipsey Valley Rd., Buhl, Ala. 35446; Doyle F. Beams, Jr., 15667 Butler Ridge Rd., Cottondale, Ak. 35453

[21] Appl. No.: 239,575

[22] Filed: May 9, 1994

[51] Int. Cl.$^{6}$ .................... F41J 3/00

[52] U.S. Cl. .................... 273/403

[58] Field of Search .............. 273/348, 403, 404, 407, 273/408

[56] References Cited

U.S. PATENT DOCUMENTS

| | | | |
|---|---|---|---|
| 1,818,939 | 8/1931 | Brading | 273/403 |
| 4,846,043 | 7/1989 | Langsam | 273/403 |
| 5,308,084 | 5/1994 | Morrell | 273/403 |

FOREIGN PATENT DOCUMENTS

| | | | |
|---|---|---|---|
| 2572804 | 5/1986 | France | 273/403 |

*Primary Examiner*—Mark S. Graham

[57] ABSTRACT

A repair kit for three-dimensional animal targets section comprising a three-dimensional animal target having a target area marked in the central section on both sides thereof; a hole formed in the target in the marked target area, the hole being undercut interior of the external surface of the target; a plurality of ribbons stuffed within the holes on both sides of the target to form a mass into which an arrow is to be shot and held; a plurality of ribbons wrapped around the target over the hole and stuffed material to hold the stuffed material in place; and a cover positionable over the hole.

4 Claims, 3 Drawing Sheets

FIG. 3
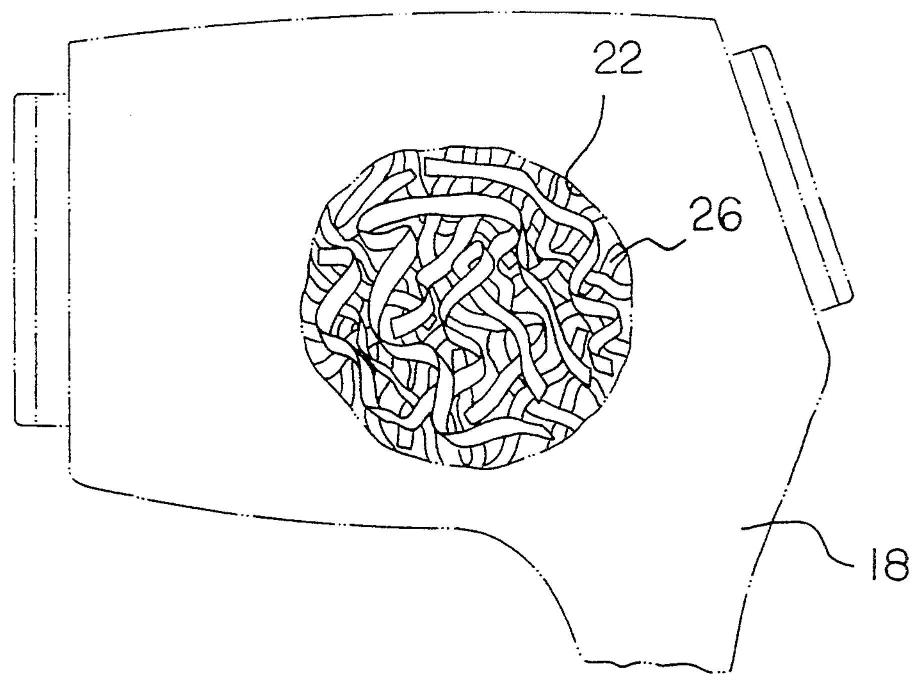
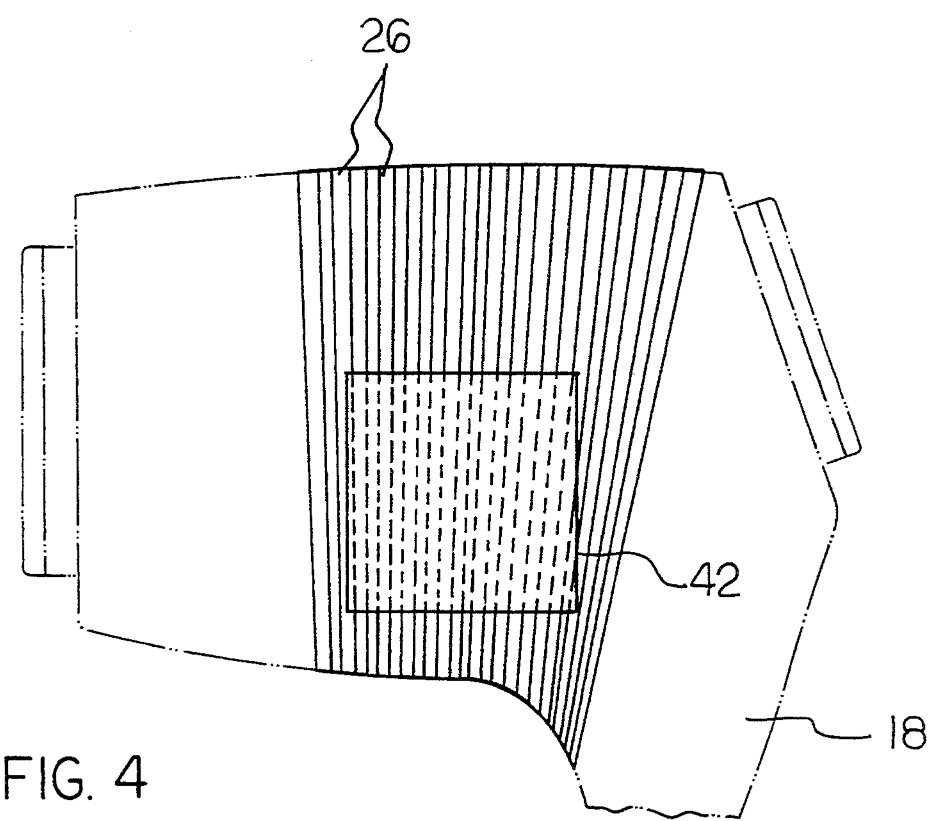
FIG. 4

REPAIR KIT FOR THREE-DIMENSIONAL ANIMAL TARGETS

BACKGROUND OF THE INVENTION

1. Field of the Invention

The present invention relates to a new and improved repair kit for three-dimensional animal targets and, more particularly, pertains to repairing three-dimensional animal targets with materials to render it more durable than the original target.

2. Description of the Prior Art

The use of targets and repair kits of various constructions is known in the prior art. More specifically, targets and repair kits of various constructions heretofore devised and utilized for the purpose of repairing or replacing targets with known materials and procedures are known to consist basically of familiar, expected, and obvious structural configurations, notwithstanding the myriad of designs encompassed by the crowded prior art which has been developed for the fulfillment of countless objectives and requirements.

The prior art discloses a large number of targets and repair kits of various constructions. By way of example, U.S. Pat. Nos. 4,042,240 to Kinart, 4,244,585 to Croll and 4,470,603 to Myers disclose archery targets.

U.S. Pat. No. 4,565,376 to Croll discloses an animal simulating three-dimensional archery target and method of manufacture.

Lastly, U.S. Pat. No. 5,002,285 to Morrell discloses an archery target with a free floating central core formed by a plurality of stacked sheets of a tightly woven nylon material.

In this respect, the repair kit for three-dimensional animal targets according to the present invention substantially departs from the conventional concepts and designs of the prior art, and in doing so provides an apparatus primarily developed for the purpose of repairing three-dimensional animal targets with materials to render it more durable than the original target.

Therefore, it can be appreciated that there exists a continuing need for a new and improved repair kit for three-dimensional animal targets which can be used for repairing three-dimensional animal targets with materials to render it more durable than the original target. In this regard, the present invention substantially fulfills this need.

SUMMARY OF THE INVENTION

In view of the foregoing disadvantages inherent in the known types of targets and repair kits of various constructions now present in the prior art, the present invention provides a new and improved repair kit for three-dimensional animal targets. As such, the general purpose of the present invention, which will be described subsequently in greater detail, is to provide a new and improved repair kit for three-dimensional animal targets and methods which have all the advantages of the prior art and none of the disadvantages.

To attain this, the present invention essentially comprises a new and improved repair kit for three-dimensional animal targets comprising, in combination, a three-dimensional animal target having a target area marked in the central section on both sides thereof; a hole formed in the target in the marked target area, the hole being undercut interior of the external surface of the target; a plurality of thermoplastic plastic ribbon material stuffed within the holes on both sides of the target to form a mass into which an arrow is to be shot and held; a plurality of thermoplastic plastic ribbon material wrapped around the target over the hole and stuffed material to hold the stuffed material in place; and a cover of a generally rectangular configuration positionable over the target with target area lines formed on the exterior surface in the area over the hole, the cover having rectangular cut-outs in the forward lower regions to accommodate the legs of the target, pile-type fasteners formed on the lower edge of the target and couplable with respect to each other to hold the target in place, an elastic band secured to the front lower ends of the cover for positioning underneath the target forward of the legs, pile-type pads secured on the interior surface of the target in the lower forward area adapted to releasably couple with respect to associated pile-type pads on the exterior surface of the target in front of the legs.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent of legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved repair kit for three-dimensional animal targets which has all the advantages of the prior art targets and repair kits of various constructions and none of the disadvantages.

It is another object of the present invention to provide a new and improved repair kit for three-dimensional animal targets which may be easily and efficiently manufactured and marketed.

It is a further object of the present invention to provide a new and improved repair kit for three-dimensional animal targets which is of a durable and reliable construction.

An even further object of the present invention is to provide a new and improved repair kit for three-dimensional animal targets which is susceptible of a low cost of manufacture with regard to both materials and labor, and which accordingly is then susceptible of low prices of sale to the consuming public, thereby making such repair kit for three-dimensional animal targets economically available to the buying public.

Still yet another object of the present invention is to provide a new and improved repair kit for three-dimensional animal targets which provides in the apparatuses and methods of the prior art some of the advantages thereof, while simultaneously overcoming some of the disadvantages normally associated therewith.

Even still another object of the present invention is to repair three-dimensional animal targets with materials to render it more durable than the original target.

Lastly, it is an object of the present invention to provide a repair kit for three-dimensional animal targets section comprising a three-dimensional animal target having a target area marked in the central section on both sides thereof; a hole formed in the target in the marked target area, the hole being undercut interior of the external surface of the target; a plurality of ribbons stuffed within the holes on both sides of the target to form a mass into which an arrow is to be shot and held; a plurality of ribbons wrapped around the target over the hole and stuffed material to hold the stuffed material in place; and a cover positionable over the hole.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 3 is a side elevational view of the central section of the target illustrating the hole and the material inserted therein.

FIG. 4 is an illustration of the ribbon material wrapped around the three-dimensional target including the hole and material therein.

The same reference numerals refer to the same parts throughout the various Figures.

DESCRIPTION OF THE PREFERRED EMBODIMENT

Figure 1:
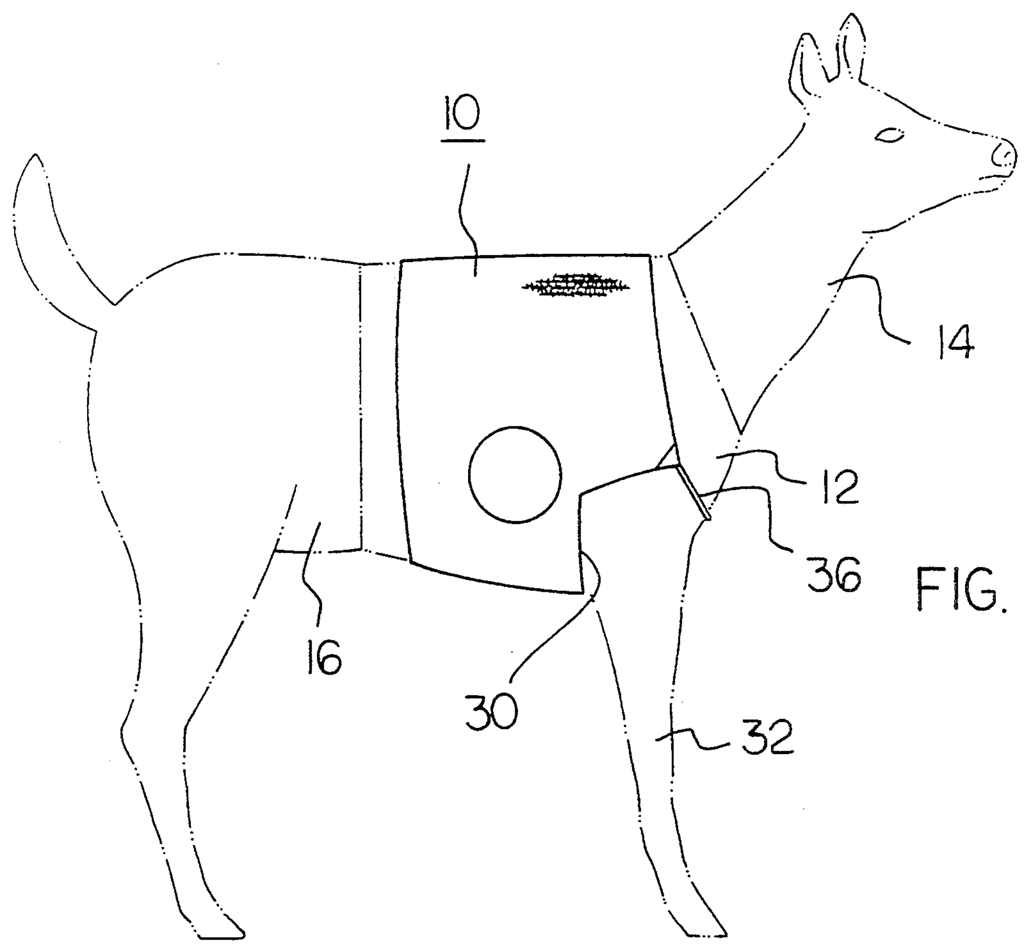
FIG. 1 is a perspective view of the preferred embodiment of the new and improved repair kit for three-dimensional animal targets constructed in accordance with the principles of the present invention.
Figure 2:
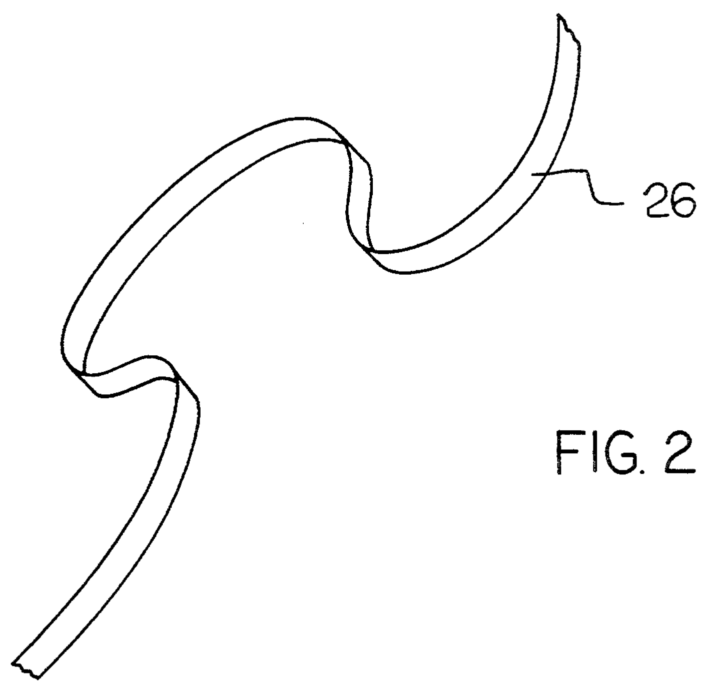
FIG. 2 is a perspective view of a piece of ribbon forming the material to be used for filling a hole cut in the target to be repaired.
Figure 5:
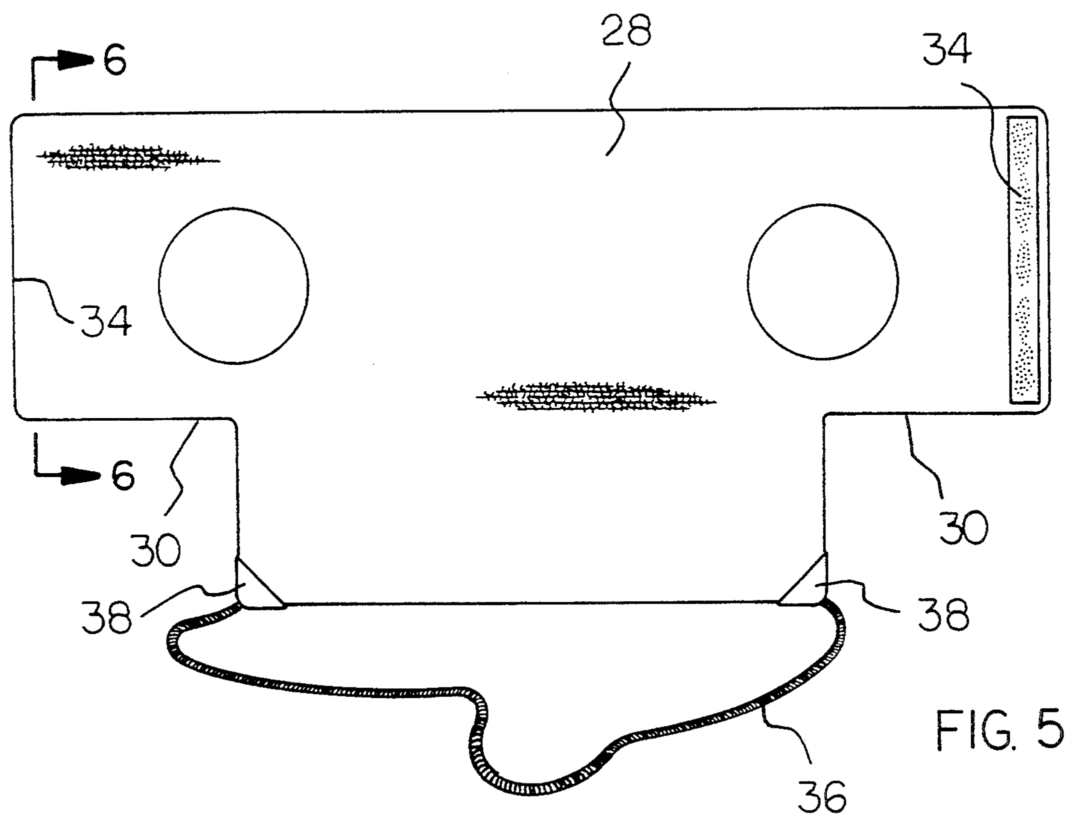
FIG. 5 is a front elevational view of the cover positionable over the three-dimensional target, hole packing material and wrapping.
Figure 6:
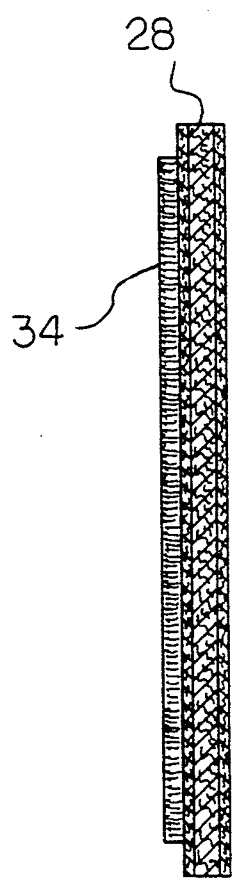
FIG. 6 is a cross-sectional view of the cover taken along line 6—6 of FIG. 5.

With reference now to the drawings, and in particular to FIGS. 1 through 6 thereof, the preferred embodiment of the new and improved repair kit for three-dimensional animal targets embodying the principles and concepts of the present invention and generally designated by the reference numeral 10 will be described.

The present invention, the new and improved repair kit for three-dimensional animal targets is a system 10 comprised of a plurality of components. Such components in their broadest context include a three-dimensional animal target, a hole, a plurality of ribbon material stuffed in the hole, a plurality of ribbon material wrapped around the target, the hole and stuffed material, a cover and a piece of corrugated cardboard located immediately beneath the cover.

Such components are specifically configured and correlated with respect to each other so as to attain the desired objective.

More specifically, the central component of the system 10 is a three-dimensional animal target 12. Such target is conventional and has a forward section 14, a rearward section 16 and a central section 18 therebetween. A target area 20 is marked in the central section on both sides thereof.

A hole 22 is formed in the target in the marked target area. The hole is undercut interior of the external surface 24 of the target.

After the hole is formed, a plurality of thermoplastic plastic ribbon material is stuffed into the holes. It is stuffed in on both sides of the target. Within the hole such material forms a mass into which an arrow is to be shot. The tight packing of the material into the mass of stuffed material will ensure that a well shot arrow will be held in the target area. Note FIG. 3.

Subsequent to the stuffing of the hole, there is provided a plurality of thermoplastic plastic ribbon material 26 wrapped around the target. Such wrapped material extends over the hole as well as over the stuffed material. The wrapping is to hold the stuffed material in place with respect to the target. Note FIG. 4.

Next provided is a cover 28. The cover is of a generally rectangular configuration. Note FIG. 5. Such cover is positionable over the target area lines formed on the exterior surface in the area of the holes. The cover has rectangular cutouts 30 in the forward lower regions. This is to accommodate the legs 32 of the target.

Additional securement of the cover to the target is through pile-type fasteners 34 formed on the lower edges of the target cover. Such edges are couplable with respect to each other to hold the target cover in place. In addition, an elastic band 36 is secured to the lower front ends of the cover for positioning underneath the target forward of the legs. Additional pile-type pads 38 are secured to the interior surface of the target cover in the lower forward area. Such are for releasable coupling with respect to associated pile-type pads on the exterior surface of the target in front of the legs.

The final product is shown in FIG. 1.

The preferred materials for the ribbon material for both stuffing as well as for wrapping could be any cloth or plastic material. Such material is preferably flexible with limited stretchability. A wide variety of materials could be used. Thermoplastic plastic materials have been shown to function beneficially for both the stuffing as well as the wrapping purposes. Further, the material for the stuffing need not be the same as that for the wrapping.

The preferred material for the cover is a loose woven poly material. A wide variety of other flexible, durable materials could be utilized. Consider, for example, burlap.

One last component is a corrugated cardboard panel. Such panel is adapted to be located over the wrapping and beneath the cover. In this manner, when arrows shot from weaker bows as by children penetrate the fabric, they will stand erect and remain in the location where initially hit.

The invention will be used as a repair kit for three-dimensional animal targets. The present invention will enable longer use of badly shot up centers of targets by the application of the repair kit rather than having to discard them. The repaired area lasts longer than the original target. The repaired area may also be re-repaired by restuffing the center. The target will last longer and be more economical to use.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A repair kit for three-dimensional animal targets comprising, in combination:

a three-dimensional animal target having an external surface, a forward section with legs, a rearward section and a central section therebetween with legs and with a target area marked in the central section on both sides thereof;

a hole formed in the target in the marked target area, the hole being undercut interior of the external surface of the target;

a plurality of thermoplastic plastic ribbon material stuffed within the holes on both sides of the target to form a mass into which an arrow is to be shot and held;

a plurality of thermoplastic plastic ribbon material wrapped around the target over the hole and stuffed material to hold the stuffed material in place; and a cover of a generally rectangular configuration positionable over the target with target area lines formed on the exterior surface of the cover adjacent to the hole, the cover having rectangular cut-outs in forward lower regions to accommodate the legs of the target, pile-type fasteners formed on a lower edge of the cover and couplable with respect to each other to hold the cover in place, an elastic band secured to front lower ends of the cover for positioning underneath the target forward of the legs, pile-type pads secured on the interior surface of the cover in a lower forward area adapted to releasably couple with respect to associated pile-type pads on the exterior surface of the target in front of the legs.

2. A repair kit for three-dimensional animal targets section comprising:

a three-dimensional animal target having a target area marked in a central section on both sides thereof;

a hole formed in the target in the marked target area, the hole being undercut interior of the external surface of the target;

a plurality of ribbons stuffed within the hole on both sides of the target to form a mass into which an arrow is to be shot and held;

a plurality of ribbons wrapped around the target over the hole and stuffed material to hold the stuffed material in place; and a cover positionable over the hole.

3. The apparatus as set forth in claim 2 wherein the cover is of a generally rectangular configuration positionable over thė target with target area lines formed on the exterior surface of the cover adjacent to the hole, the cover having rectangular cut-outs in forward lower regions to accommodate portions of the target, pile-type fasteners formed on a lower edge of the cover and couplable with respect to each other to hold the cover in place, an elastic band secured to front lower ends of the cover for positioning underneath the target, pile-type pads secured on the interior surface of the cover in a lower forward area adapted to releasably couple with respect to associated pile-type pads on the exterior surface of the target.

4. The apparatus as set forth in claim 2 and further including a piece of corrugated cardboard beneath the cover.

* * * * *